United States Patent
Sunohara

(10) Patent No.: US 8,293,590 B2
(45) Date of Patent: Oct. 23, 2012

(54) ACTIVE MATRIX SUBSTRATE IN A DISPLAY DEVICE AND METHOD FOR MANUFACTURING ACTIVE MATRIX SUBSTRATE

(75) Inventor: Hideaki Sunohara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 288 days.

(21) Appl. No.: 12/676,372

(22) PCT Filed: May 23, 2008

(86) PCT No.: PCT/JP2008/059551
§ 371 (c)(1),
(2), (4) Date: Mar. 4, 2010

(87) PCT Pub. No.: WO2009/031342
PCT Pub. Date: Mar. 12, 2009

(65) Prior Publication Data
US 2010/0207130 A1 Aug. 19, 2010

(30) Foreign Application Priority Data
Sep. 5, 2007 (JP) ................. 2007-230421

(51) Int. Cl.
*H01L 21/82* (2006.01)
*H01L 29/18* (2006.01)
*G02F 1/136* (2006.01)

(52) U.S. Cl. .......... 438/129; 438/149; 349/42; 349/111; 257/88; 257/204; 257/E51.005; 257/E33.053; 257/E27.111; 257/E21.704

(58) Field of Classification Search .................. None
See application file for complete search history.

(56) References Cited

U.S. PATENT DOCUMENTS

| | | | | |
|---|---|---|---|---|
| 6,091,467 A * | 7/2000 | Kubo et al. | | 349/44 |
| 6,888,586 B2 * | 5/2005 | Yoo et al. | | 349/43 |
| 7,095,459 B2 * | 8/2006 | Yoo et al. | | 349/42 |
| 7,352,004 B2 * | 4/2008 | Lee et al. | | 257/59 |
| 7,602,358 B2 * | 10/2009 | Tsubata et al. | | 345/87 |
| 2005/0285987 A1 | 12/2005 | Azumada et al. | | |
| 2008/0002076 A1 * | 1/2008 | Yagi et al. | | 349/39 |

FOREIGN PATENT DOCUMENTS

| | | |
|---|---|---|
| JP | 10-065174 | 3/1998 |
| JP | 2000-305104 | 11/2000 |
| JP | 2004-004991 | 1/2004 |
| JP | 2006-039509 | 2/2006 |
| JP | 2006-332557 | 12/2006 |
| JP | 2007-052040 | 3/2007 |

OTHER PUBLICATIONS

International Search Report for PCT/JP2008/059551, mailed Aug. 12, 2008.

* cited by examiner

*Primary Examiner* — Alonzo Chambliss
(74) *Attorney, Agent, or Firm* — Nixon & Vanderhye P.C.

(57) ABSTRACT

An active matrix substrate 40 according to the present invention includes a conductive film 44 and a wiring 80 for supplying a signal to the conductive film 44, characterized in that the wiring 80 includes a first conductive layer 61 and a second conductive layer 62 having a relatively large line width in comparison with the first conductive layer 61 and laminated so as to cover the first conductive layer 61, and the conductive film 44 is arranged in a matrix pattern, and at least a portion of the conductive film 44 is disposed overlapping the wiring 80.

5 Claims, 19 Drawing Sheets

ACTIVE MATRIX SUBSTRATE IN A DISPLAY DEVICE AND METHOD FOR MANUFACTURING ACTIVE MATRIX SUBSTRATE

This application is the U.S. national phase of International Application No. PCT/JP2008/059551, filed 23 May 2008, which designated the U.S. and claims priority to Japanese Application No. 2007-230421 filed 5 Sep. 2007, the entire contents of each of which are hereby incorporated by reference.

TECHNICAL FIELD

The present invention relates to an active matrix substrate, a display device, and a method for manufacturing an active matrix substrate.

BACKGROUND ART

Recently, as high definition television receivers or large television receivers spread rapidly, there is an increasing demand for high definition display devices. Liquid crystal displays (LCD) are one of the leading flat panel displays (FPD) along with electro luminescence (EL) displays and plasma display panels (PDP). The liquid crystal displays have advantages of light weight, space-saving, low cost, low energy consumption or the like.

At present, most of the liquid crystal displays used in the high definition television receivers or large television receivers are transmissive liquid crystal displays. The transmissive liquid crystal displays have a configuration in which liquid crystal is held between two glass substrates each having an electrode formed thereon. A liquid crystal molecular orientation in a liquid crystal layer is changed by a voltage applied to the electrodes formed on the inner sides of the substrates. The optical characteristics of the liquid crystal layer are changed based on the change in liquid crystal molecular orientation as described above. Accordingly, from an orientation relationship with a polarizing plate fixed on the substrate, a transmitted light intensity from a backlight is adjusted to display an image.

Although the transmissive liquid crystal displays are broadly divided into a passive type and an active type from the standpoint of a driving method, most of the present transmissive liquid crystal displays are the active type. In the active type liquid crystal displays, a switching element is provided in each pixel, and the operation of each pixel is thereby controlled. A three-terminal thin film transistor (TFT) is often used as the switching element.

An active matrix substrate where active elements such as the thin film transistors are formed over the entire surface is manufactured by repeating processes of photolithography and etching a plurality of times. That is, a gate wiring, a gate insulating film, a semiconductor layer, a source wiring, a drain wiring, an interlayer insulating film, and a pixel electrode are sequentially laminated respectively by the photolithography process, the etching process or the like.

Meanwhile, display characteristics such as high brightness and visibility are required in this type of liquid crystal display. Various efforts have been made to improve a so-called aperture ratio. For example, a technique disclosed in Patent Document 1 is one of the examples. In Patent Document 1, a pixel electrode is provided overlapping a gate wiring or a source wiring that is a light shielding portion, to thereby increase the aperture ratio and improve the display characteristics.

[Patent Document 1] Japanese Patent Laid-Open No. 2007-52040

Problems to be Solved by the Invention

Meanwhile, in the case where a pixel electrode overlaps a wiring via an interlayer insulating film as in the technique disclosed in Patent Document 1, a leak may occur between the pixel electrode and the wiring to cause a display failure due to a point defect if a film defect occurs in the interlayer insulating film. Especially when the interlayer insulating film includes only one layer, such a film defect occurs more easily.

DISCLOSURE OF THE INVENTION

The present invention has been made in view of the aforementioned problems, and it is an object of the present invention to provide an active matrix substrate in which a drive failure is difficult to occur by preferably preventing or suppressing a trouble that leak occurs between conductive films even when a defect occurs in an insulating film interposed between the conductive films at a portion where the conductive films overlap each other, and a manufacturing method thereof. Also, it is another object of the present invention to provide a highly reliable display device which uses the above active matrix substrate.

Means for Solving the Problems

In order to achieve the above object, an active matrix substrate according to the present invention includes a conductive film, and a wiring for supplying a signal to the conductive film, characterized in that the wiring includes a first conductive layer and a second conductive layer having a relatively large line width in comparison with the first conductive layer and laminated so as to cover the first conductive layer, and the conductive film is arranged in a matrix pattern, and at least a portion of the conductive film is disposed overlapping the wiring.

With the active matrix substrate, a portion of the conductive film overlaps the wiring where the second conductive layer covers the first conductive layer having a relatively small line width. Therefore, even when the conductive film and the wiring directly contact each other due to, for example, a film defect or the like occurring in an insulating film interposed between the wiring and the conductive film at the overlapping portion, the second conductive layer having a large line width causes the conductive film to be cut off. It is thereby possible to prevent a leak between the conductive film (a portion which is not overlapping the wiring) and the wiring. That is, a peripheral portion of the second conductive layer projecting from the first conductive layer causes the conductive film to be cut off, to thereby insulate the portion of the conductive film which is overlapping the wiring from the portion which is not overlapping the wiring.

BEST MODE FOR CARRYING OUT THE INVENTION

In the following, an embodiment of a display device according to the present invention will be described with reference to the drawings.

Figure 1:
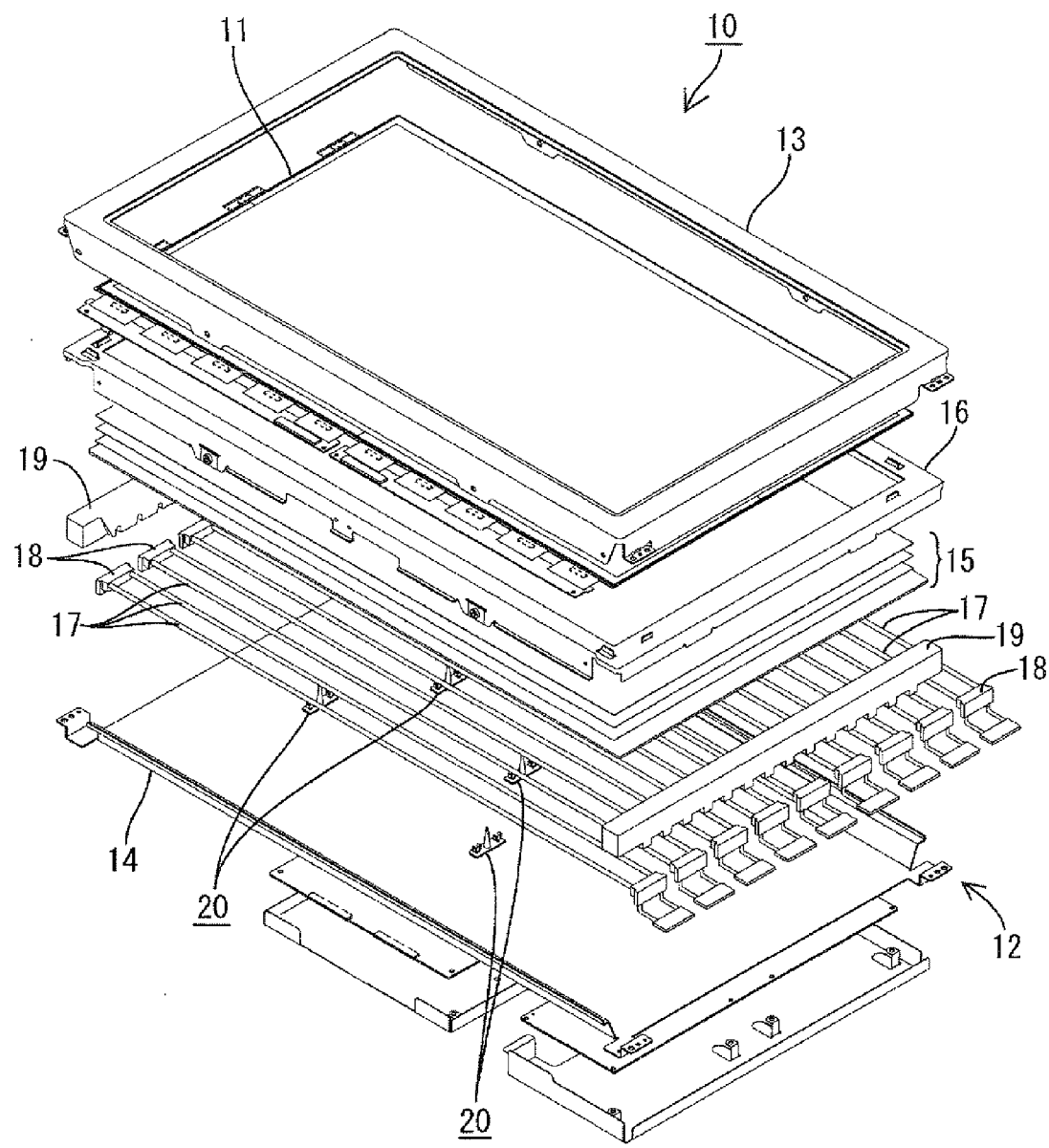
FIG. 1 is a perspective view schematically illustrating the configuration of a liquid crystal display device according to a present embodiment.
Figure 2:
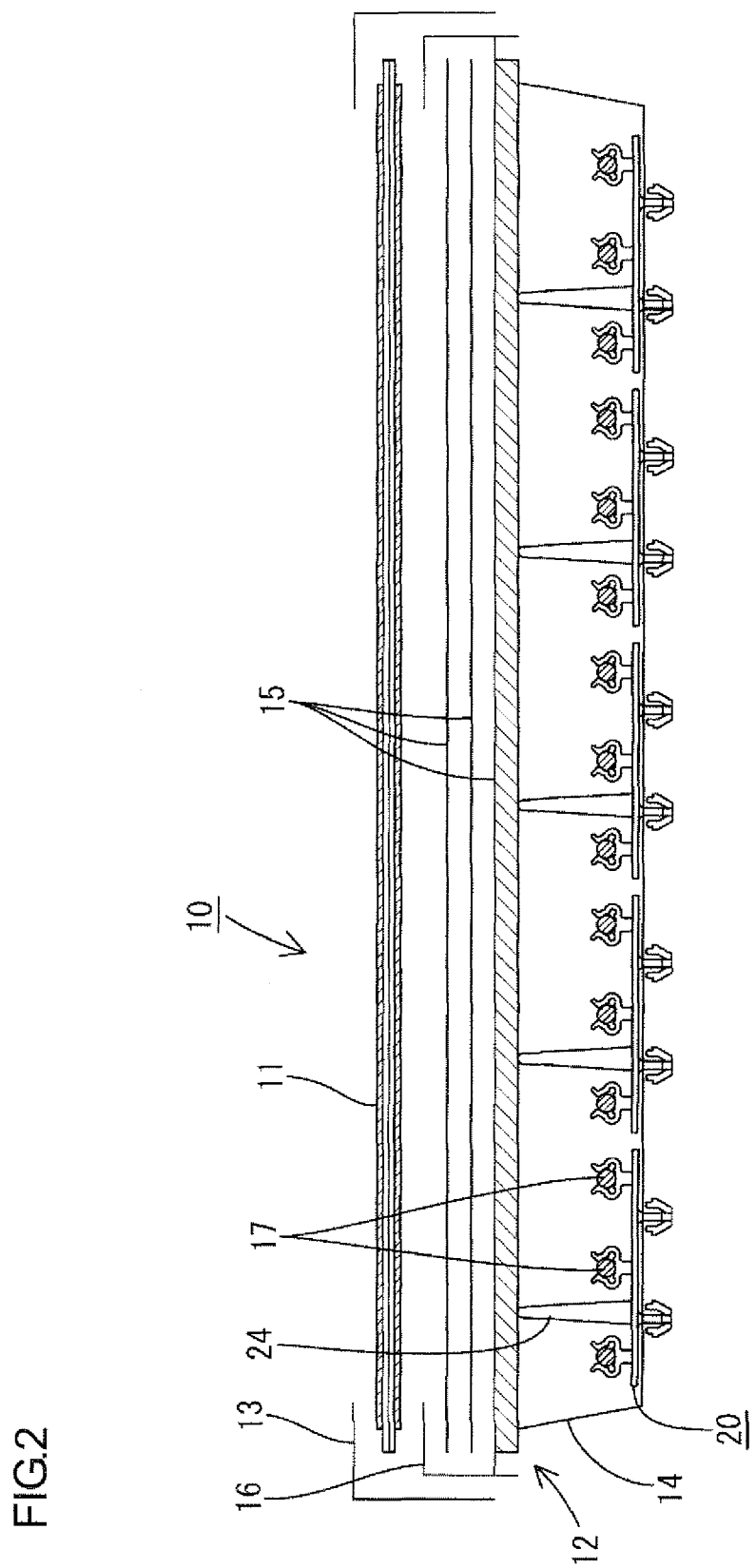
FIG. 2 is a sectional view schematically illustrating the configuration of the liquid crystal display device in FIG. 1.
Figure 3:
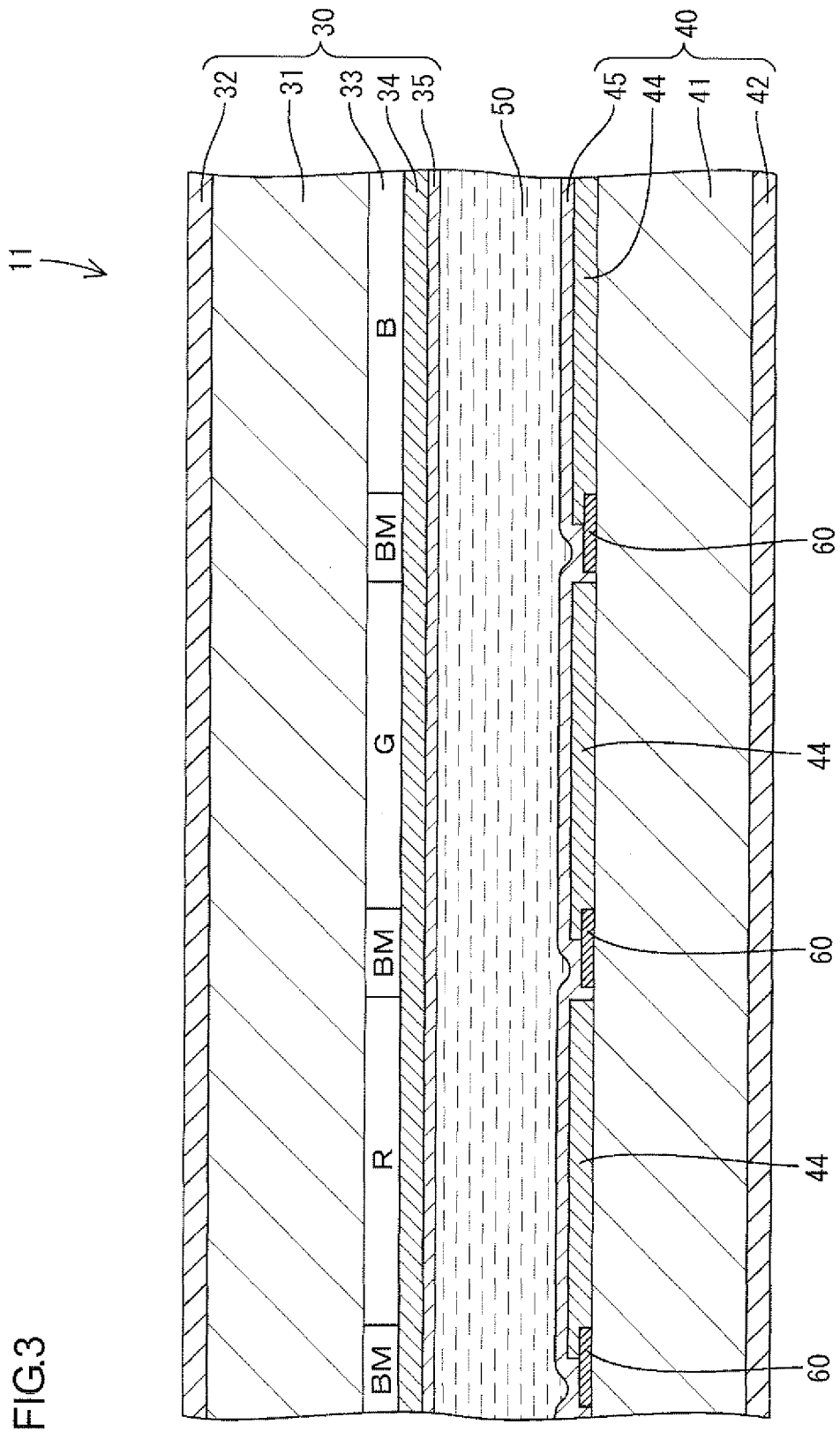
FIG. 3 is a sectional view illustrating the main portion configuration (a portion of a liquid crystal panel) of the liquid crystal display device in FIG. 1.
Figure 4:
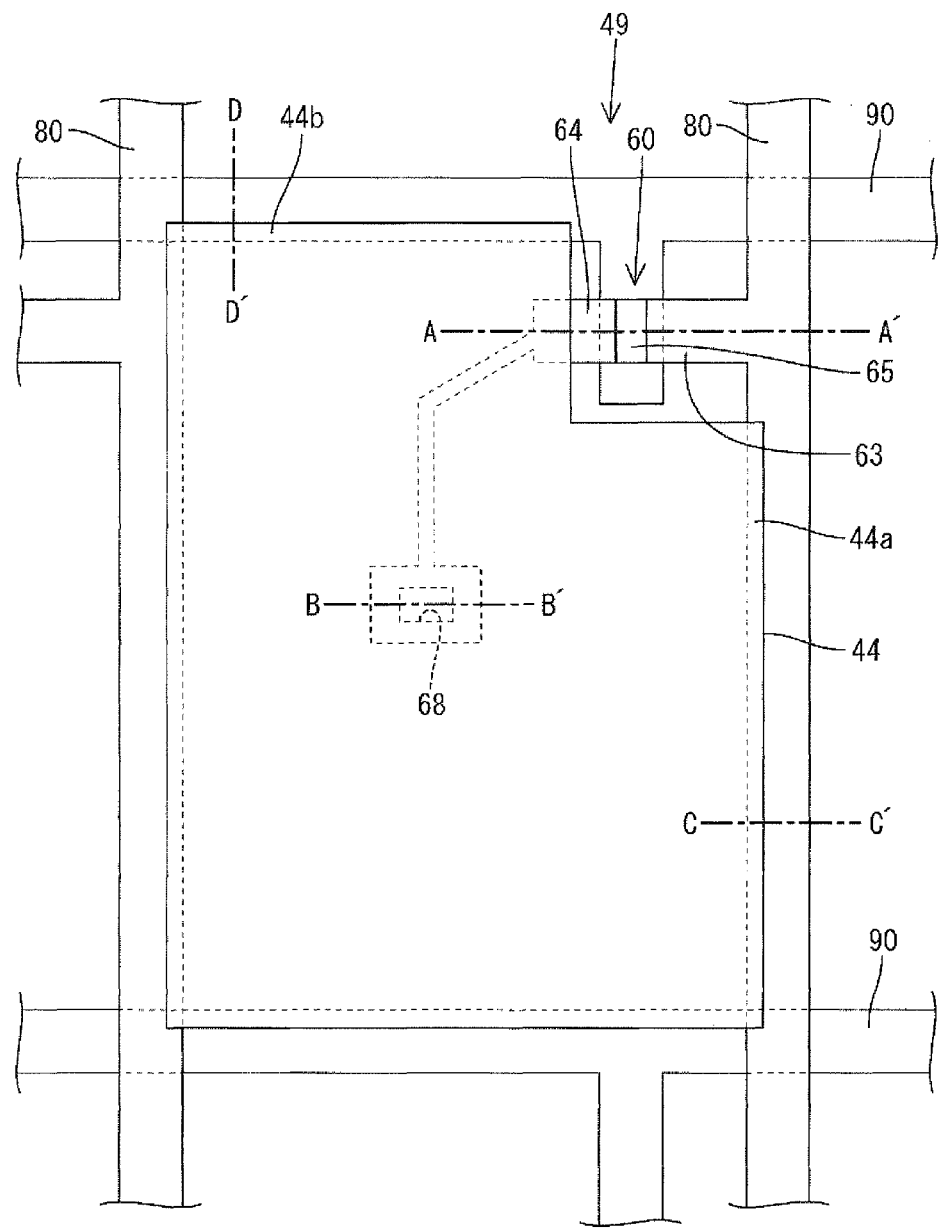
FIG. 4 is a plan view illustrating the pixel configuration of the liquid crystal display device in FIG. 1.
Figure 5:
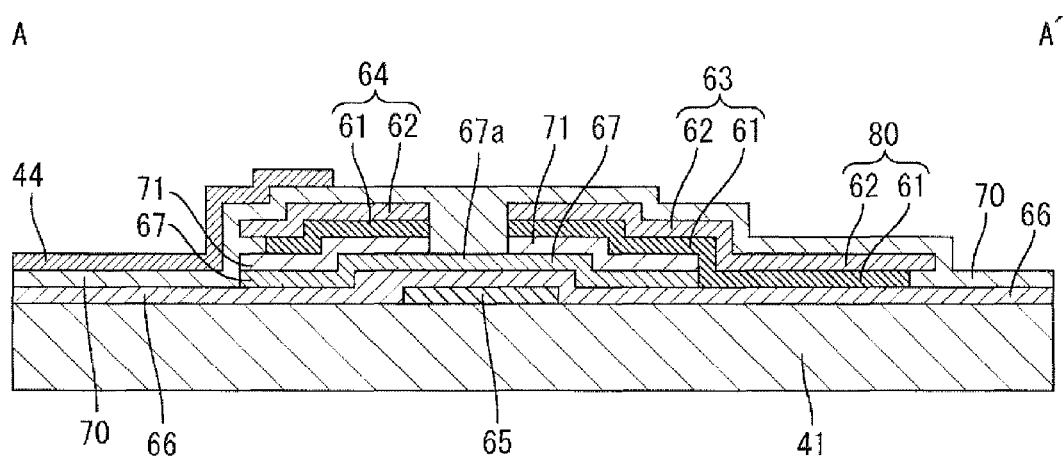
FIG. 5 is a sectional view taken along a line A-A' in FIG. 4.
Figure 6:
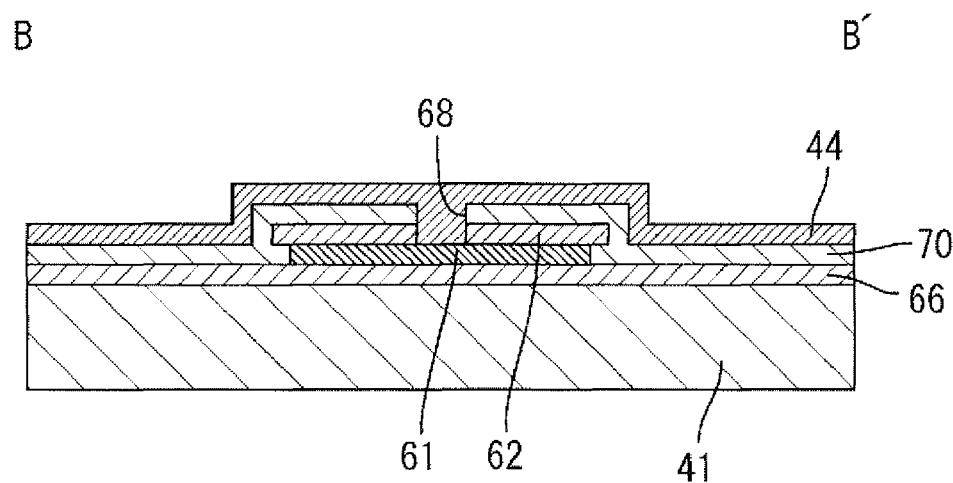
FIG. 6 is a sectional view taken along a line B-B' in FIG. 4.
Figure 7:
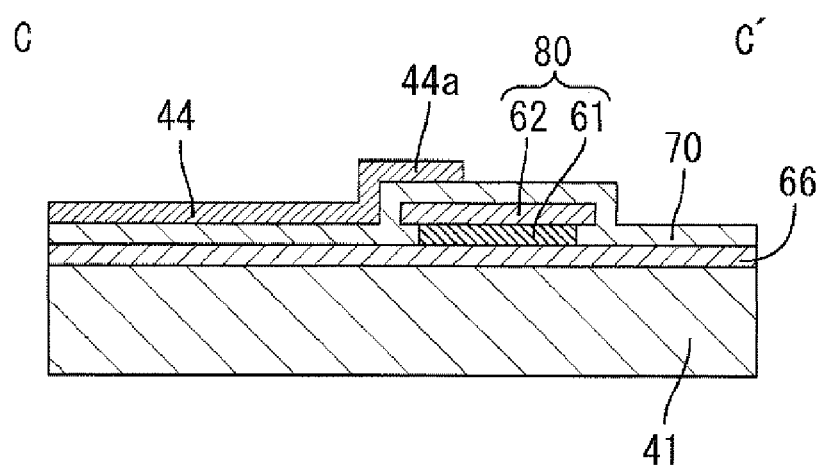
FIG. 7 is a sectional view taken along a line C-C' in FIG. 4.
Figure 8:
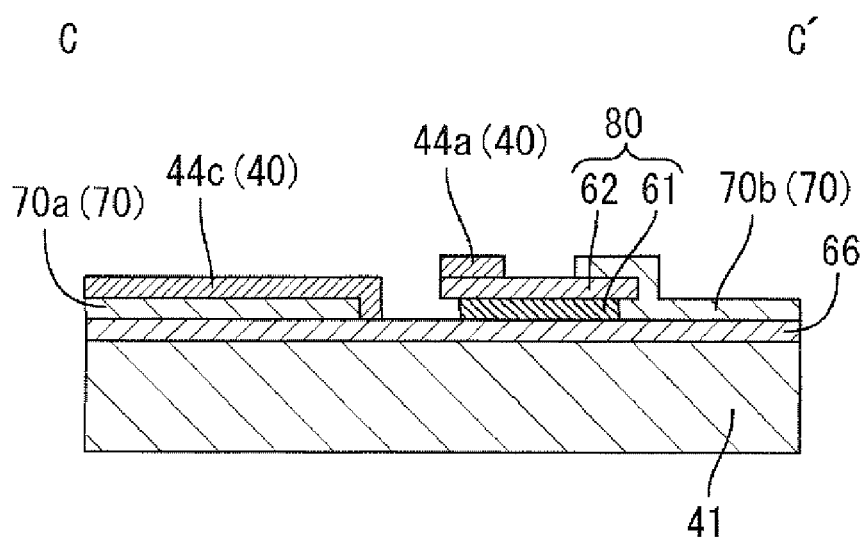
FIG. 8 is a sectional view taken along the line C-C' in FIG. 4 and illustrating a state in which a film defect occurs.

FIG. 1 is a perspective view schematically illustrating the configuration of a liquid crystal display device according to the present embodiment. FIG. 2 is a sectional view schematically illustrating the configuration of the liquid crystal display device. FIG. 3 is a sectional view illustrating the main portion configuration (a portion of a liquid crystal panel) of the liquid crystal display device. FIG. 4 is a plan view illustrating the pixel configuration of the liquid crystal display device. FIG. 5 is a sectional view taken along a line A-A' in FIG. 4. FIG. 6 is a sectional view taken along a line B-B' in FIG. 4. FIG. 7 is a sectional view taken along a line C-C' in FIG. 4. FIG. 8 is a sectional view taken along the line C-C' in FIG. 4 and illustrating a state in which a film defect occurs.

A liquid crystal display device (a display device) 10 shown in FIGS. 1 and 2 includes a rectangular liquid crystal panel 11, and a backlight unit 12 that is an external light source, which are integrally held by a bezel 13 or the like.

The backlight unit 12 is a so-called direct type backlight unit. The backlight unit 12 has a configuration in which light sources (here, cold cathode tubes 17) are disposed parallel to each other directly below the back surface of the panel surface (the display surface) of the liquid crystal panel 11 along the panel surface. The backlight unit 12 includes a metal base 14 having a rectangular substantially-box shape whose upper surface side opens, a plurality of optical members 15 (a diffusing plate, a diffusing sheet, a lens sheet, and a reflection polarizing plate in the order from the lower side in the drawing) mounted so as to cover the opening portion of the base 14, a frame 16 for holding the optical members 15 on the base 14, the cold cathode tubes 17 as lamps housed in the base 14, rubber (for example, silicon rubber) holders 18 for holding the both end portions of the cold cathode tubes 17, lamp holders 19 for holding the group of cold cathode tubes 17 and the group of holders 18 together, and lamp clips 20 for holding the intermediate portions of the cold cathode tubes 17 excluding the both end portions.

As shown in FIG. 3, the liquid crystal panel 11 has a configuration in which a pair of substrates 30 and 40 are adhered to each other with a predetermined gap therebetween and liquid crystal is enclosed between the both substrates 30 and 40. The liquid crystal forms a liquid crystal layer 50.

The substrate 40 is an element substrate (an active matrix substrate). The substrate 40 includes a thin film transistor (TFT, a switching element) 60 as a semiconductor element formed on the liquid crystal layer 50 side of a glass substrate 41, a pixel electrode 44 electrically connected to the thin film transistor 60, and an orientation film 45 formed on the liquid crystal layer 50 side of the thin film transistor 60 and the pixel electrode 44. A polarizing plate 42 is provided on the opposite side from the liquid crystal layer 50 side of the glass substrate 41.

The pixel electrode 44 includes a transparent conductive film such as ITO (indium tin oxide), for example, and is formed in a matrix-like pattern on the liquid crystal layer 50 side of the element substrate 40. To be more specific, the pixel electrode 44 is connected to a drain electrode 64 (see FIGS. 4 and 5) of the thin film transistor 60, and a voltage is selectively applied thereto by the switching operation of the thin film transistor 60. Also, the orientation film 45 is formed of a polyimide rubbing orientation film, for example. An object obtained by instilling iodine or dye into a transparent film and extending the film in one direction is employed as the polarizing plate 42, for example.

Meanwhile, the substrate 30 is a counter substrate. The substrate 30 includes a color filter 33 formed on the liquid crystal layer 50 side of a glass substrate 31 and having coloring portions R (red), G (green), and B (blue) that can selectively transmit light of respective colors R, G, and B, a counter electrode 34 formed on the liquid crystal layer 50 side of the color filter 33, and an orientation film 35 formed on the liquid crystal layer 50 side of the counter electrode 34. A polarizing plate 32 is provided on the opposite side from the liquid crystal layer 50 side of the glass substrate 31.

The color filter 33 includes a black matrix BM disposed at the boundary of the coloring portions R, G, and B. The black matrix BM is disposed overlapping a non-pixel portion of the element substrate 40 (that is, a region where the thin film transistor 60 is formed) so as to cover the non-pixel portion. Also, the counter electrode 34 includes a transparent conductive film such as ITO (indium tin oxide), for example, and is formed in an overall solid pattern on the liquid crystal layer 50 side of the counter substrate 30. Also, the orientation film 35 is formed of a polyimide rubbing orientation film, for example. An object obtained by instilling iodine or dye into a transparent film and extending the film in one direction is employed as the polarizing plate 32, for example.

As described above, the liquid crystal display device 10 according to the present embodiment includes the thin film transistor 60 as the semiconductor element, and a pixel including the thin film transistor 60 has a configuration as shown in FIG. 4.

In the liquid crystal display device 10 according to the present embodiment, a plurality of pixels 49 are configured in a matrix pattern, and the thin film transistor 60 is formed in each of the pixels 49 as the semiconductor element for pixel switching.

The thin film transistor 60 includes a source electrode 63, the drain electrode 64, and a gate electrode 65. A source wiring 80 for supplying an image signal is connected to the source electrode 63. The image signal to be written into the source wiring 80 may be line-sequentially supplied, or each group of image signals may be supplied to a plurality of source wirings 80 adjacent to each other. The source wiring 80 is connected to a driving circuit for supplying the image signal to the pixel electrode 44 via a contact hole 68.

Also, a gate wiring 90 is connected to the gate electrode 65 of the thin film transistor 60. It is configured such that a scanning signal is line-sequentially applied in a pulse to the gate wiring 90 at a predetermined timing.

The pixel electrode 44 is connected to the drain electrode 64 of the thin film transistor 60 via the contact hole 68. When the thin film transistor 60 as the switching element is brought into an ON state for a given period of time, the image signal supplied from the source wiring 80 is written into each pixel 49 at a predetermined timing. The image signal at a predetermined level written into the liquid crystal via the pixel electrode 44 as described above is maintained for a given period of time between the pixel electrode 44 and the counter electrode 34 (see FIG. 3). Here, to prevent the maintained image signal from leaking, a storage capacity (not shown) is additionally provided parallel to a liquid crystal capacity formed between the pixel electrode 44 and the counter electrode 34 (see FIG. 3).

Also, in the present embodiment, in order to increase an aperture ratio, the pixel electrode 44 includes an overlapping portion 44a where the pixel electrode 44 overlaps the source wiring 80, and an overlapping portion 44b where the pixel electrode 44 overlaps the gate wiring 90. That is, by forming the pixel electrode 44 in a matrix pattern so as to overlap the respective wirings 80 and 90 in plan view, bright and high-quality display can be achieved.

As described above, the thin film transistor 60 is provided on the glass substrate 41 constituting the element substrate 40. To be more specific, as shown in FIG. 5, the thin film transistor 60 includes the gate electrode 65 formed on the glass substrate 41, a gate insulating film 66 formed on the gate electrode 65, a silicon film 67 formed on the gate insulating film 66 and having a channel region 67a, an ohmic layer 71 formed on the silicon film 67, the source electrode 63 connected to one end of the silicon film 67, and the drain electrode 64 connected to the other end of the silicon film 67 and connected to the source electrode 63 via the channel region 67a.

The gate electrode 65 and the gate wiring 90 connected to the gate electrode 65 can be formed of a single metal film of chromium (Cr), tantalum (Ta), titanium (Ti) or the like in addition to aluminum (Al), or a laminated film thereof, for example.

The gate insulating film, 66 can be formed of silicon oxide (SiOx) or the like in addition to silicon nitride (SiNx), for example.

The silicon film 67 can be formed of amorphous silicon (a–Si) or the like, for example.

The ohmic layer 71 can be formed of amorphous silicon (n+Si) heavily doped with n-type impurities such as phosphorus (P) or the like, for example.

Each of the source electrode 63, the drain electrode 64, and the source wiring 80 connected to the source electrode 63 is configured as a laminated film where a first conductive layer 61 and a second conductive layer 62 are laminated (see FIG. 7). The first conductive layer 61 on the lower layer side is formed of aluminum (Al). The second conductive layer 62 on the upper layer side is formed of titanium (Ti). The second conductive layer 62 has a relatively large line width in comparison with the first conductive layer 61, and is laminated so as to cover the first conductive layer 61.

Also, an interlayer insulating film (a passivation film) 70 is formed on the source electrode 63, the drain electrode 64, the source wiring 80 and the gate wiring 90. The drain electrode 64 is connected to the pixel electrode 44 via the contact hole 68 formed in the interlayer insulating film 70 (see FIG. 6). The interlayer insulating film 70 can be formed of an acrylic resin film or the like in addition to an inorganic insulating film such as silicon nitride (SiNx), for example.

In the liquid crystal display device 10 according to the present embodiment as described above, the pixel electrode 44 formed on the element substrate (the active matrix substrate) 40 includes the overlapping portion 44a where the pixel electrode 44 overlaps the source wiring 80, and the source wiring 80 includes the first conductive layer 61 and the second conductive layer 62 as particularly shown in FIG. 7. The second conductive layer 62 having a relatively large line width is configured to cover the first conductive layer 61 having a small line width. Thus, as shown in FIG. 8, even when the pixel electrode 44 and the source wiring 80 directly contact each other due to a film defect or the like occurring in the interlayer insulating film 70 interposed between the pixel electrode 44 and the source wiring 80 at the portion where the pixel electrode 44 overlaps the source wiring 80, the second conductive layer 62 having a large line width causes the pixel electrode 44 to be cut off. Thus, it is possible to prevent a leak between the pixel electrode 44 (a portion 44c which is not overlapping the source wiring 80) and the source wiring 80. That is, a peripheral portion of the second conductive layer 62 projecting from the first conductive layer 61 causes the film of the pixel electrode 44 to be cut off, to thereby insulate the portion 44a of the pixel electrode 44 which is overlapping the source wiring 80 from the portion 44c which is not overlapping the source wiring 80 as shown in the drawing. Note that the film defect means a local separation of a first portion 70a and a second portion 70b due to the interlayer insulating film 70 being cut off at an edge portion of the source wiring 80 as shown in FIG. 8.

Next, a method for manufacturing the liquid crystal display device 10 according to the present embodiment will be described. Here, steps of manufacturing the element substrate 40 in the manufacturing method will be particularly described with reference to FIGS. 9 to 17. In FIGS. 9 to 17, the left side in the drawing illustrates the manufacturing steps relative to the section along A-A' in FIG. 4, and the right side in the drawing illustrates the manufacturing steps relative to the section along c-C' in FIG. 4.

Figure 9:
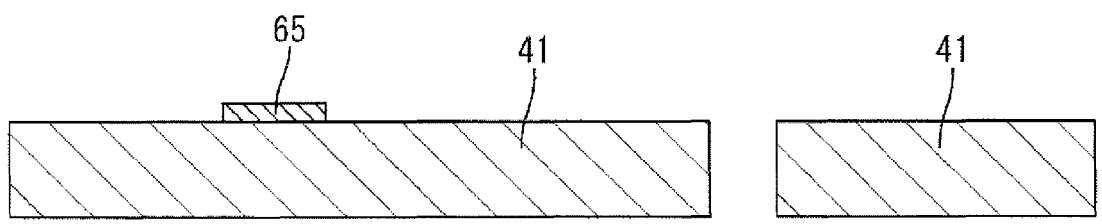
FIG. 9 is an explanatory view illustrating one step according to a method for manufacturing the liquid crystal display device in FIG. 1.

First, as shown in FIG. 9, the glass substrate 41 is prepared. The gate electrode 65 is formed on the glass substrate 41. The gate electrode 65 can be formed by patterning, by mask etching using a photolithography method, a conductive film which is formed by a sputtering method, for example. To be more specific, a conductive film having a laminated film of three layers titanium-aluminum-titanium is patterned by wet etching.

Figure 10:
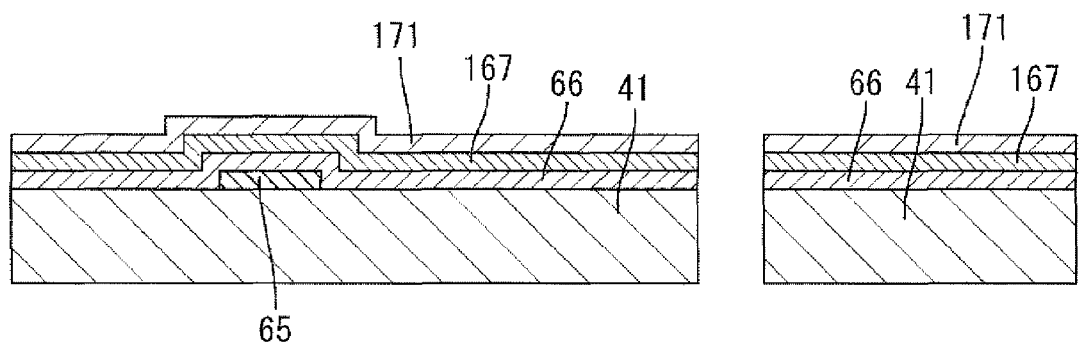
FIG. 10 is an explanatory view illustrating one step according to the method for manufacturing the liquid crystal display device in FIG. 1.

Subsequently, as shown in FIG. 10, the gate insulating film 66, a first silicon film (amorphous silicon (a–Si)) 167, and a second silicon film (n+Si) 171 are formed on the gate electrode 65 respectively by a plasma CVD method, for example. The gate insulating film 66 can be formed of silicon oxide (SiOx) or the like in addition to silicon nitride (SiNx), for example.

Figure 11:
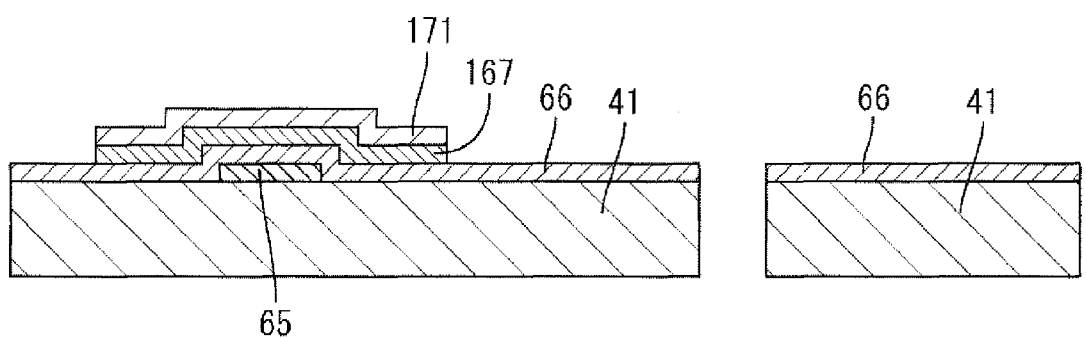
FIG. 11 is an explanatory view illustrating one step according to the method for manufacturing the liquid crystal display device in FIG. 1.

Subsequently, as shown in FIG. 11, the first silicon film 167 and the second silicon film 171 formed above are patterned by mask etching using a photolithography method. To be more specific, the first silicon film 167 and the second silicon film 171 are patterned by dry etching. Accordingly, the first silicon film 167 and the second silicon film 171 having patterns as shown in FIG. 11 are formed.

Figure 12:
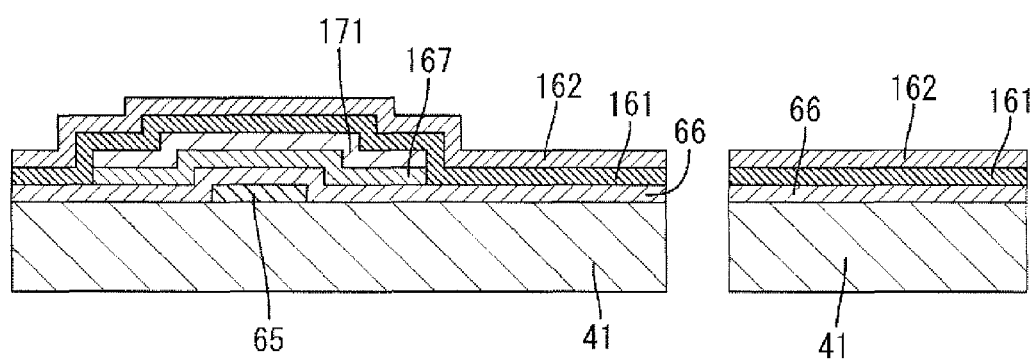
FIG. 12 is an explanatory view illustrating one step according to the method for manufacturing the liquid crystal display device in FIG. 1.
Figure 13:
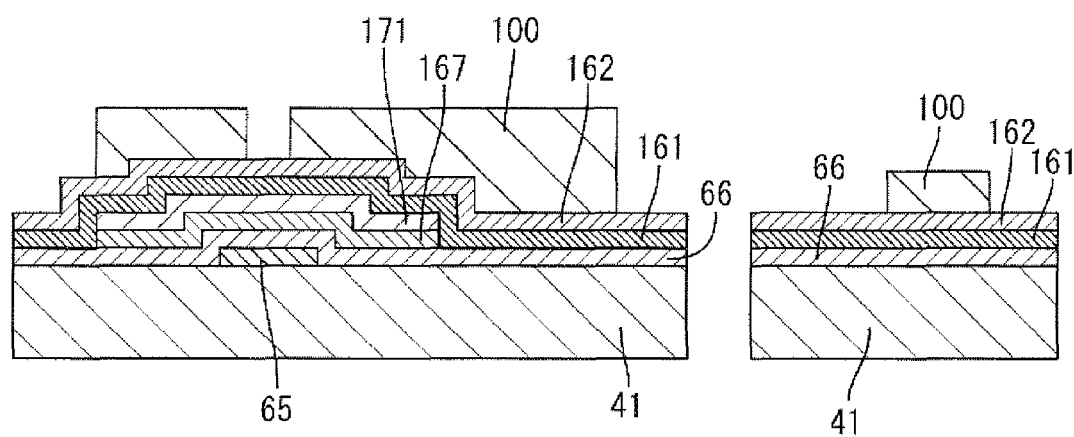
FIG. 13 is an explanatory view illustrating one step according to the method for manufacturing the liquid crystal display device in FIG. 1.

Subsequently, as shown in FIG. 12, a conductive film 161 made of aluminum and a conductive film 162 made of titanium are formed by a sputtering method. A laminated film of the conductive film 161 and the conductive film 162 is patterned by using a mask 100 as shown in FIG. 13.

Figure 14:
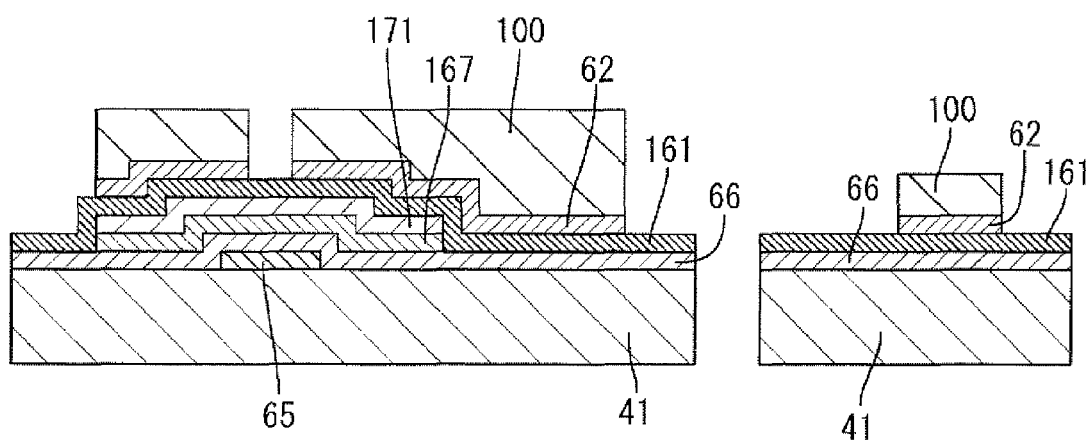
FIG. 14 is an explanatory view illustrating one step according to the method for manufacturing the liquid crystal display device in FIG. 1.
Figure 15:
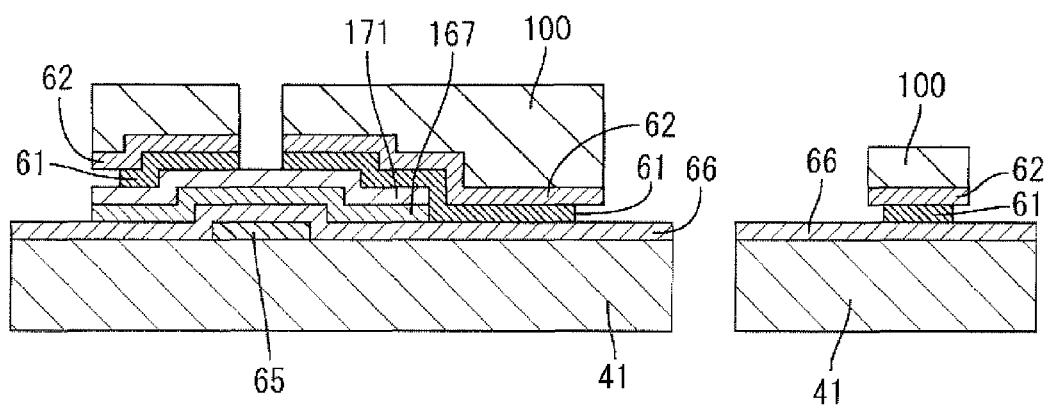
FIG. 15 is an explanatory view illustrating one step according to the method for manufacturing the liquid crystal display device in FIG. 1.
Figure 16:
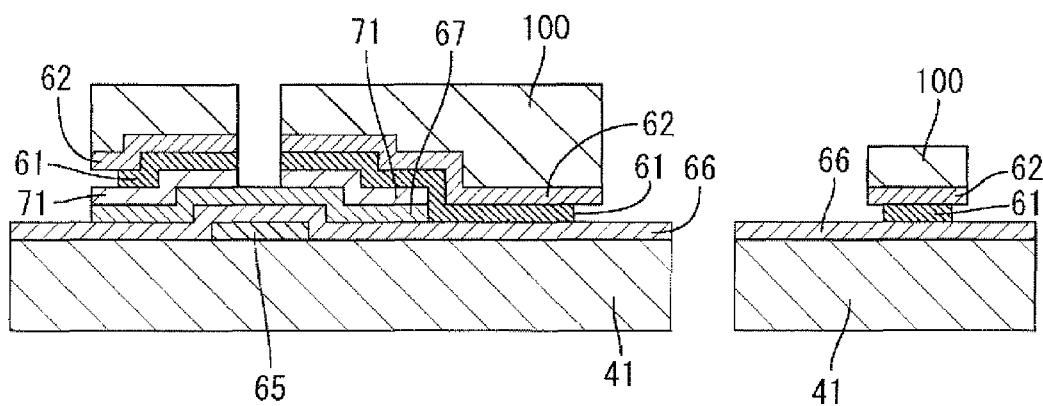
FIG. 16 is an explanatory view illustrating one step according to the method for manufacturing the liquid crystal display device in FIG. 1.

To be more specific, the conductive film 162 disposed on the upper layer side is patterned by dry etching, first. The second conductive layer 62 is thereby formed as shown in FIG. 14. After that, the conductive film 161 disposed on the lower layer side is patterned by wet etching (a mixture of phosphoric acid, nitric acid, and acetic acid is used as an etching solution) by using the same mask 100. At this point, the conductive film 161 is side-etched by a predetermined amount, so that the first conductive layer 61 is formed as shown in FIG. 15. That is, the first conductive layer 61 covered by the second conductive layer 62 having a relatively large line width is formed. The second silicon film 171 is dry-etched by using the same mask 100, so that the silicon film 67 and the ohmic layer 71 having patterns as shown in FIG. 16 are formed.

Figure 17:
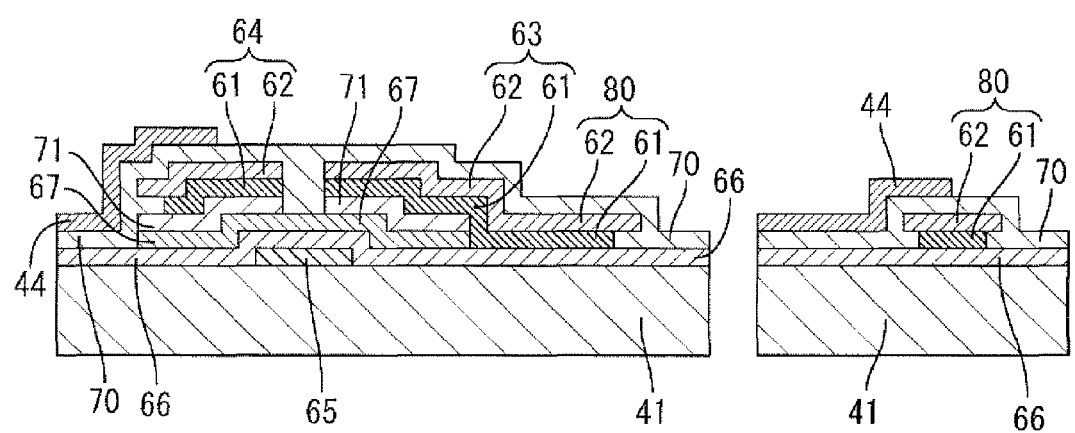
FIG. 17 is an explanatory view illustrating one step according to the method for manufacturing the liquid crystal display device in FIG. 1.

Subsequently, the interlayer insulating film 70 is formed by a plasma CVD method as shown in FIG. 17 after removing the mask 100. The interlayer insulating film 70 and the gate insulating film 66 described above are patterned by mask etching (specifically, dry etching) using a photolithography method. Thereafter, an ITO film is further formed by sputtering, and is patterned by mask etching (specifically, wet etching) using a photolithography method. The pixel electrode 44 is thereby formed. At this point, the pixel electrode 44 is patterned such that the overlapping portions 44a and 44b are particularly formed with respect to the source wiring 80 and the gate wiring 90.

The element substrate 40 manufactured by the above method is adhered to the counter substrate 30 manufactured by another method via a sealing agent (not shown). The liquid crystal is injected into a space between the substrates, and an injection port (not shown) is sealed. The polarizing plates 32 and 42 are respectively adhered to the substrates 30 and 40. The liquid crystal panel 11 as shown in FIG. 3 is thereby completed. After that, the backlight unit 12 is mounted on the liquid crystal panel 11 via the bezel 13 or the like, so that the liquid crystal display device 10 as shown in FIGS. 1 and 2 is completed.

With the manufacturing method as described above, with respect to the laminated film of the conductive film 161 and the conductive film 162, the second conductive layer 62 is formed by selectively etching the conductive film 162 as a first stage, and the first conductive layer 61 having the pattern with a smaller line width than the second conductive layer 62 is formed by side etching at the time of selectively etching the conductive film 161 as a second stage. Accordingly, the source wiring 80 having a laminated structure in which the second conductive layer 62 covers the first conductive layer 61 is provided. That is, the element substrate 40 having the configuration according to the aforementioned embodiment can be preferably manufactured.

Although the configuration of the source wiring 80 is described above, the gate wiring 90 may be also constituted by a laminated wiring. To be more specific, as shown in the section along a line D-D' (see FIG. 4) in FIGS. 18 and 19, the gate wiring 90 includes the laminated wiring. Here, a conductive layer 65a made of titanium, a conductive layer 65b made of aluminum, and a conductive layer 65c made of titanium in the order from the lower layer constitute the gate wiring 90. In this case, the conductive layer 65c on the upper layer side is also formed to have a larger line width than the conductive layer 65b on the lower layer side, and cover the conductive layer 65b on the lower layer side. The pixel electrode 44 is formed overlapping the gate wiring 90.

Figure 19:
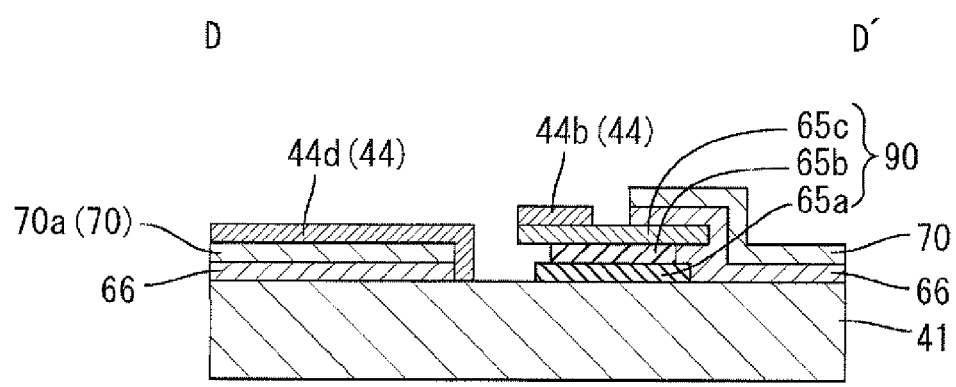
FIG. 19 is a sectional view taken along the line D-D' in FIG. 4 and illustrating a state in which a film defect occurs.

In this case, for example, as shown in FIG. 19, even when the pixel electrode 44 and the gate wiring 90 directly contact each other due to a film defect or the like occurring in the interlayer insulating film 70 interposed between the pixel electrode 44 and the gate wiring 90 at a portion where the pixel electrode 44 overlaps the gate wiring 90, the conductive layer 65c having a large line width also causes the pixel electrode 44 to be cut off. Thus, it is possible to prevent a leak between the pixel electrode 44 (a portion 44d which is not overlapping the gate wiring 90) and the gate wiring 90. That is, a peripheral portion of the conductive layer 65c projecting from the conductive layer 65b causes the film of the pixel electrode 44 to be cut off, to thereby insulate the portion 44b of the pixel electrode 44 which is overlapping the gate wiring 90 from the portion 44d which is not overlapping the gate wiring 90 as shown in the drawing.

Figure 18:
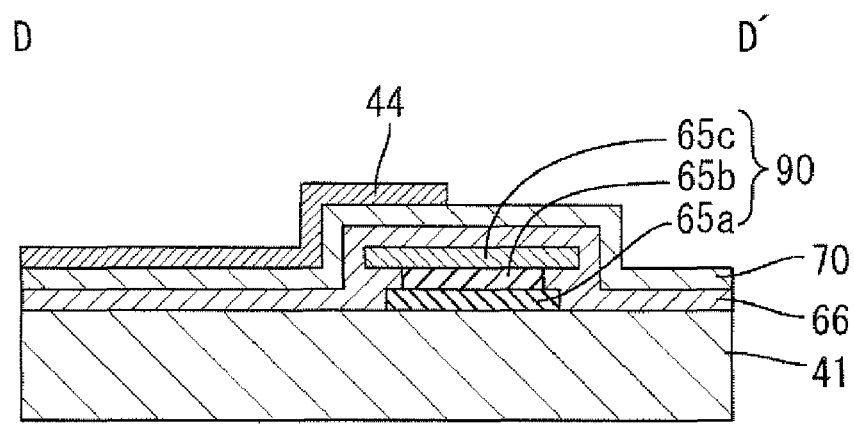
FIG. 18 is a sectional view taken along a line D-D' in FIG. 4.

In order to form the conductive layer 65c on the upper layer side and the conductive layer 65b on the lower layer side such that the conductive layer 65c covers the conductive layer 65b, dry etching and wet etching (side etching) are performed by the same mask as described above to thereby achieve a laminated structure. However, the laminated structure may be also achieved even when dry etching is continuously performed, for example. That is, by employing different etching conditions between the conductive layer 65c on the upper layer side and the conductive layer 65b on the lower layer side, specifically, employing different pressures inside a chamber, different RP powers, different flow rates of chlorine gas or the like between the conductive layers 65c and 65b, the laminated structure as shown in FIG. 18 can be provided. For example, when the conductive layer 65b made of aluminum on the lower layer side is etched, the pressure in the chamber is increased, the RP power is decreased and the flow rate of chlorine gas is increased in comparison with the case of etching the conductive layer 65c made of titanium on the upper layer side. The conductive layer 65b on the lower layer side can be thereby patterned to have a smaller line width than the conductive layer 65c on the upper layer side. The line width adjustment of each layer in the laminated wiring by using dry etching as described above can be also applied to when the first conductive layer 61 and the second conductive layer 62 of the source wiring 80 are patterned.

Although one embodiment according to the present invention is described above, the present invention should not be limited to the embodiment as described above.

For example, in the present embodiment, the liquid crystal display device having the thin film transistor is described as one example of the display device according to the present invention. However, for example, an EL display and a plasma display panel or the like driving the pixel and having the thin film transistor similar to the present embodiment are also included in the present invention.

The invention claimed is:

1. A method for manufacturing an active matrix substrate comprising:
    a wiring forming step comprising the steps of
    forming a first conductive layer,
    forming a second conductive layer on the first conductive layer,
    patterning the second conductive layer by performing selective etching on the second conductive layer with respect to a laminated film of the first conductive layer and the second conductive layer, and
    patterning the first conductive layer into a shape with a smaller line width than that of the second conductive layer by performing selective etching on the first conductive layer after patterning the second conductive layer;
    an interlayer insulating film forming step of forming an interlayer insulating film on the second conductive layer; and
    a conductive film forming step of forming a conductive film arranged in a matrix pattern on the interlayer insulating film such that the conductive film covers at least a portion of the second conductive layer.

2. The method for manufacturing an active matrix substrate according to claim 1, characterized in that the step of patterning the second conductive layer and the step of patterning the first conductive layer are respectively performed by etching by using a same mask.

3. The method for manufacturing an active matrix substrate according to claim 1, characterized in that the second conductive layer is patterned by dry etching and the first conductive layer is patterned by wet etching.

4. The method for manufacturing an active matrix substrate according to claim 1, characterized in that the first conductive layer is formed by using aluminum.

5. The method for manufacturing an active matrix substrate according to claim 1, characterized in that the second conductive layer is formed by using titanium.

* * * * *